(12) United States Patent
Jaurigue et al.

(10) Patent No.: US 9,012,268 B2
(45) Date of Patent: Apr. 21, 2015

(54) LEADLESS PACKAGES AND METHOD OF MANUFACTURING SAME

(71) Applicant: STMicroelectronics, Inc., Calamba, Laguna (PH)

(72) Inventors: Jonathan Jaurigue, Calamba (PH); Rogelio Real, Calamba (PH); Francis Ann Llana, Sto Tomas Batangas (PH); Ricky Calustre, Marilao (PH); Rodolfo Gacusan, Cavite (PH)

(73) Assignee: STMicroelectronics, Inc., Lagura (PH)

( * ) Notice: Subject to any disclaimer, the term of this patent is extended or adjusted under 35 U.S.C. 154(b) by 0 days.

(21) Appl. No.: 13/931,325

(22) Filed: Jun. 28, 2013

(65) Prior Publication Data

US 2015/0001698 A1    Jan. 1, 2015

(51) Int. Cl.
| | |
|---|---|
| H01L 21/50 | (2006.01) |
| H01L 21/48 | (2006.01) |
| H01L 21/44 | (2006.01) |
| H01L 23/495 | (2006.01) |
| H01L 23/00 | (2006.01) |
| H01L 21/82 | (2006.01) |

(52) U.S. Cl.
CPC ............... *H01L 24/96* (2013.01); *H01L 21/82* (2013.01); *H01L 23/49575* (2013.01)

(58) Field of Classification Search
CPC .................... H01L 24/96; H01L 23/49575
USPC ............... 438/123, 121, 124; 257/676, 666, 257/E23.031, E23.037
See application file for complete search history.

(56) References Cited

U.S. PATENT DOCUMENTS

| | | | |
|---|---|---|---|
| 6,489,218 B1 * | 12/2002 | Kim et al. ............... | 438/460 |
| 6,812,552 B2 * | 11/2004 | Islam et al. ............. | 257/666 |
| 6,841,414 B1 * | 1/2005 | Hu et al. ................ | 438/106 |
| 7,087,461 B2 * | 8/2006 | Park et al. .............. | 438/112 |
| 7,087,462 B1 * | 8/2006 | Park et al. .............. | 438/112 |
| 7,169,651 B2 * | 1/2007 | Park et al. .............. | 438/124 |
| 8,120,152 B2 * | 2/2012 | Chang Chien et al. ... | 257/676 |
| 2006/0199308 A1 * | 9/2006 | Lee et al. .............. | 438/110 |
| 2011/0201159 A1 * | 8/2011 | Mori et al. ............. | 438/123 |

* cited by examiner

*Primary Examiner* — Luan C Thai
(74) *Attorney, Agent, or Firm* — Seed IP Law Group PLLC

(57) ABSTRACT

Embodiments of the present disclosure are directed to leadframe strips and methods of forming packages that include first separating adjacent leads of a leadframe strip and subsequently singulating components into individual packages. In one embodiment, the adjacent leads are separated by etching through the leads, thereby providing electrical isolation of the adjacent packages. In that regard, if desired, the individual adjacent packages may be electrically tested in leadframe strip form. Subsequently, the individual packages are formed by sawing through the encapsulation material.

20 Claims, 8 Drawing Sheets

LEADLESS PACKAGES AND METHOD OF MANUFACTURING SAME

BACKGROUND

1. Technical Field

Embodiments of the present disclosure are directed to leadframe strips and leadless packages, as well as methods of manufacturing leadframe strips and assembling leadless packages.

2. Description of the Related Art

Leadless (or no lead) packages are often utilized in applications in which small sized packages are desired. In general, flat leadless packages provide a near chip scale encapsulated package that includes a planar leadframe. Lands located on a bottom surface of the package and, in many cases, side surfaces of the package provide electrical connection to a board, such as a printed circuit board (PCB).

Leadless packages are typically formed from a leadframe strip of conductive material that includes a plurality of spaced apart die pads and leads that are located between adjacent die pads. The leads and die pads are typically connected together by tie bars. Electrical devices, such as integrated circuits, are secured to an upper surface of each die pad.

After the electrical devices have been electrically coupled to one or more leads, such as by wire bond or solder ball techniques, encapsulation material is provided over the upper surface of the leadframe strip and covers the electrical device and the conductive wires or solder balls. The leads of the leadframe strip and the encapsulation material are then cut through, such as by dicing, to form individual packages.

Cutting through the leadframe strip and the encapsulation material is typically done in a single dicing step. In general, the dicing step involves a saw blade that cuts through the encapsulation material and the leadframe strip. The encapsulation material and the leadframe strip are distinct materials and have different material properties. In an ideal environment, the differing materials may favor different rotational speeds and/or materials for the saw blade.

By performing the cutting in a single dicing step, the sawing process can cause saw burrs that extend beyond a bottom surface of the leads. These saw burrs can cause attachment issues during board attach. For instance, the saw burrs can prevent the packages from lying substantially flat on the surface of the board.

Moreover, friction between the saw blade and the lead can cause the leads to smear along its outer surface and in some cases into the encapsulation material. If the lead smear is significant, it can create shorting between adjacent leads.

BRIEF SUMMARY

Embodiments of the present disclosure are directed to leadframe strips and methods of forming packages that include first separating adjacent leads of a leadframe strip and subsequently singulating components into individual packages. In one embodiment, the adjacent leads are separated by etching through the leads, thereby providing electrical isolation of the adjacent packages. In that regard, if desired, the individual adjacent packages may be electrically tested in leadframe strip form. Subsequently, the individual packages are singulated by sawing through the encapsulation material.

DETAILED DESCRIPTION

Figure 1:
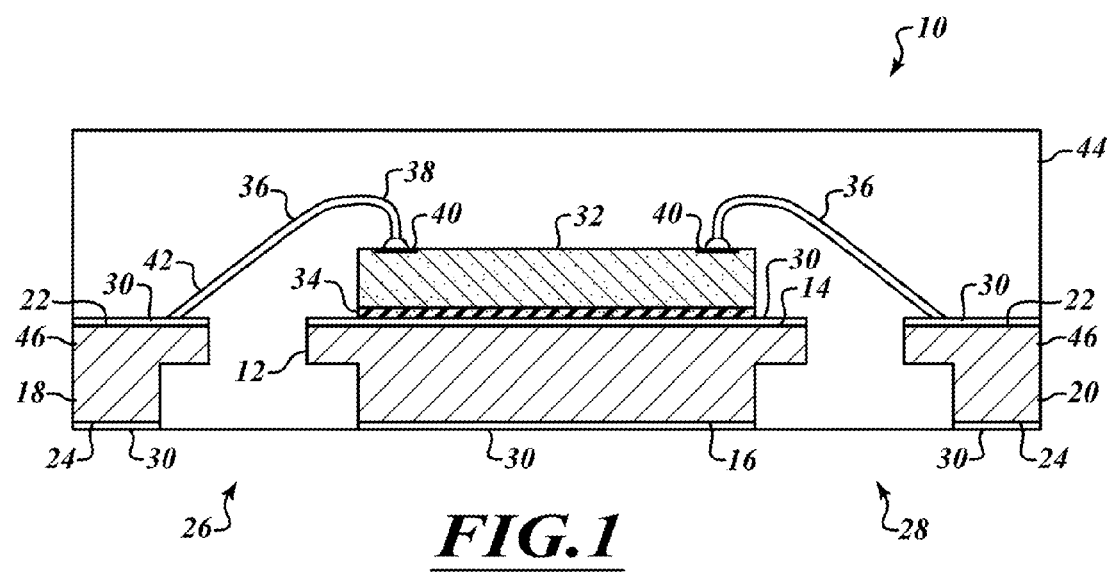
FIG. 1 is a cross-sectional view of a leadframe package made in accordance with one embodiment of the present disclosure.

FIG. 1 shows a cross-sectional view of a leadframe package 10 made in accordance with one embodiment of the disclosure. In particular, the package 10 includes a die pad 12 having upper and lower surfaces 14, 16. The package 10 further includes first and second leads 18, 20, each having upper and lower surfaces 22, 24. The first lead 18 is located proximate a first side 26 of the die pad 12, and the second lead 20 located proximate a second side 28 of the die pad 12. It is to be appreciated that any number of leads may be located proximate any number of sides of the die pad, including only one lead located proximate one side of the die pad.

The upper and lower surfaces 14, 16 of the die pad 12 and the upper and lower surfaces 22, 24 of the first and second leads 18, 20 are plated with a conductive layer 30. The conductive layer 30 may be a nanolayer or microlayer of one or more materials. For instance, the upper and lower surfaces 14, 16 and the upper and lower surfaces 22, 24 may be plated with one or more metal materials such as Ni/Pd/Ag, Ni/Pd/Au—Ag alloy, or Ni/Pd/Au/Ag. As will be explained below, the upper and lower surfaces 14, 16 of the die pad 12 and the upper and lower surfaces 22, 24 of the first and second leads 18, 20 are plated with one or more conductive materials 30 that form a mask layer for etching portions of the leadframe material that separates the first lead 18 from the second lead 20.

A semiconductor die 32 that includes an electrical device, such as an integrated circuit, is located secured to the conductive layer 30 over the upper surface 14 of the die pad 12 by an adhesive material 34. The adhesive material 34 may be any material configured to secure the die 32 to the die pad 12, such as glue, paste, tape, and the like.

Conductive wires 36 electrically couple the die 32 to the first and second leads 18, 20. For instance, a first end 38 of the conductive wire 36 is coupled to a bond pad 40 of the die 32 and a second end 42 of the conductive wire 36 is coupled to the first lead 18.

Encapsulation material 44 is located over the die pad 12 and the first and second leads 18, 20 enclosing the die 32 and the conductive wires 36. The encapsulation material 44 is also located between the first and second leads 18, 20 and the die pad 12. The outer side surface 46 of each of the first and second leads 18, 20 form outer side surfaces of the package 10 along with the encapsulation material 44. As will be explained below, in many embodiments the outer side surface 46 of the first and second leads 18, 20, in general, do not have saw burrs or have a reduction in the number and size of saw burrs.

Figure 2A:
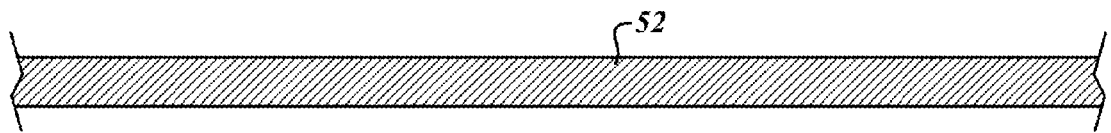
FIGS. 2A-2K illustrate side views of a portion of a conductive foil that is formed into a leadframe strip at various stages of manufacturing in accordance with one embodiment of the present disclosure.
Figure 2B:
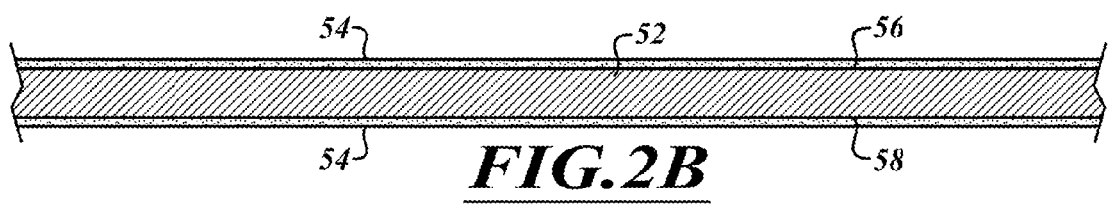
Figure 2C:
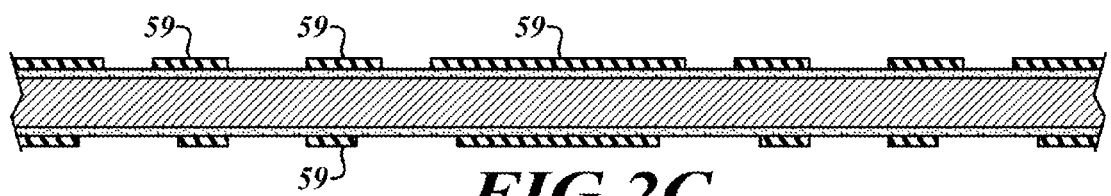
Figure 2D:
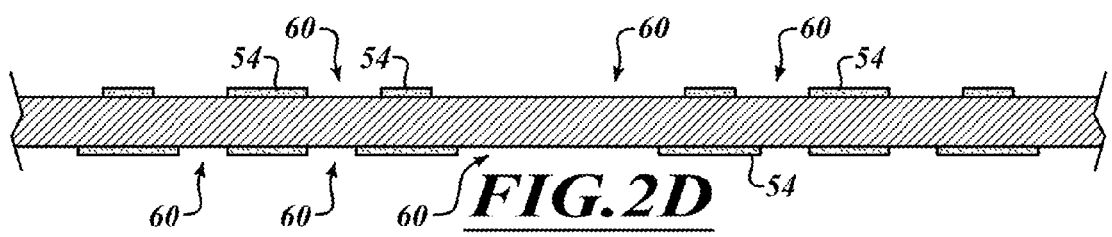
Figure 2E:
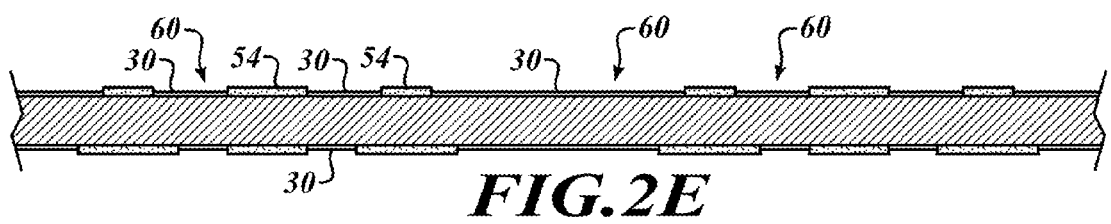
Figure 2F:
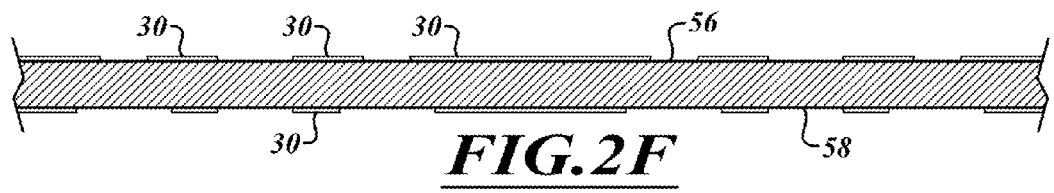
Figure 2G:
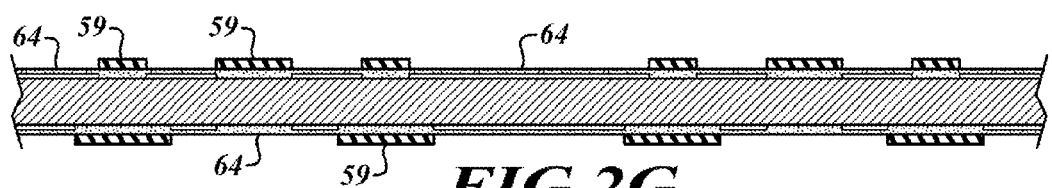
Figure 2H:
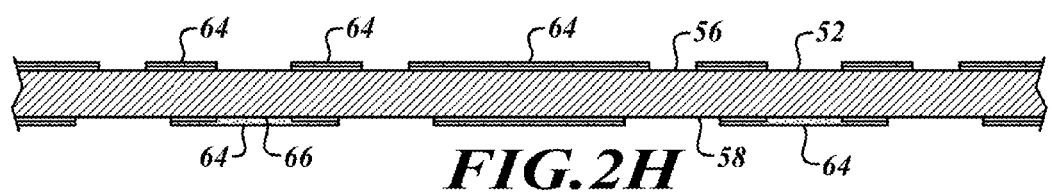
Figure 2I:
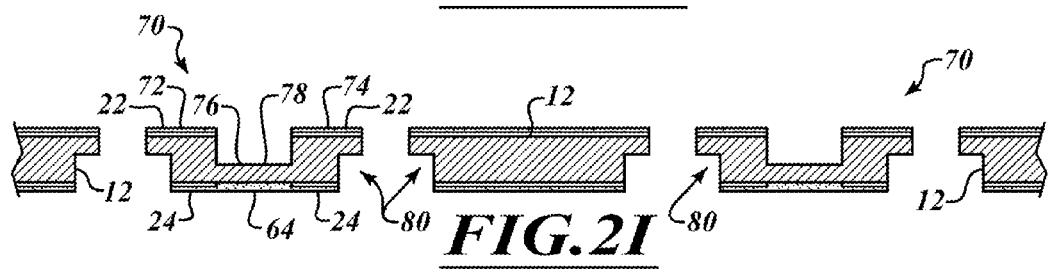
Figure 2J:
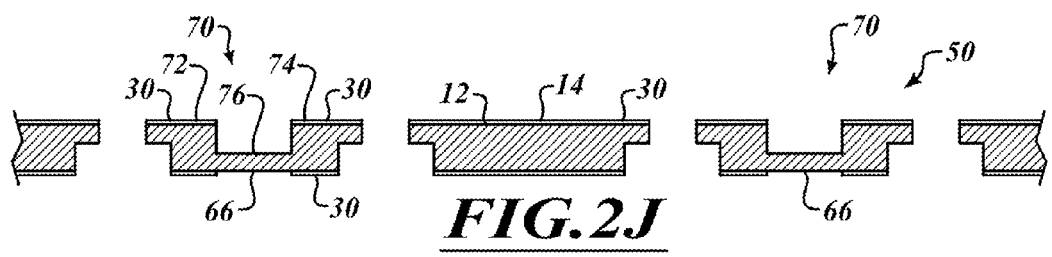
Figure 2K:
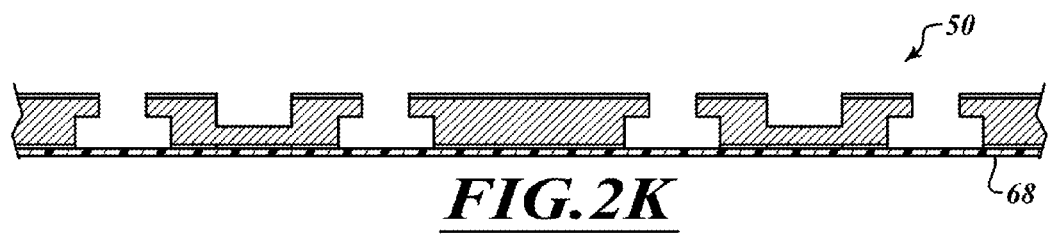

FIGS. 2A-2K illustrate side views of a portion of a conductive foil 52 that is formed into a leadframe strip 50 at various stages of manufacturing in accordance with an embodiment of the present disclosure. The leadframe strip 50 as shown in FIGS. 2J and 2K may be used to make the leadframe package 10 of FIG. 1.

FIG. 2A shows a conductive foil 52 that is the base material for forming the leadframe strip 50. The conductive foil 52 may be a metal material and in some embodiments is made of copper.

As shown in FIG. 2B, a light sensitive material 54, such as photoresist, is deposited on first and second surfaces 56, 58 of the conductive strip 50. As shown in FIGS. 2C and 2D, portions of the light sensitive material 54 are patterned to form a mask layer. That is, portions of the light sensitive material 54 may be exposed to ultraviolet radiation 59 and then removed by a photoresist developer. In particular and as shown in FIG. 2D, exposed portions of the light sensitive material 54 are removed, leaving exposed portions 60 of the conductive foil 52 on the first and second surfaces 56, 58. Although the figures illustrate a positive photoresist, the photoresist may be a negative photoresist. That is, the photoresist that is exposed to ultraviolet radiation 59 becomes insoluble to the photoresist developer.

As shown in FIG. 2E, a conductive layer 30 is formed, such as by plating techniques, on the exposed portions 60 of the conductive foil 52. The conductive layer 30 may include one or more conductive materials that are different materials from the conductive foil 52. As indicated above, the conductive layer 32 may be one or more metal materials, such as Ni/Pd/Ag, Ni/Pd/Au—Ag alloy, or Ni/Pd/Au/Ag.

As shown in FIG. 2F, the light sensitive material 54 is then removed from the first and second surfaces 56, 58, such as by conventional etching techniques. The conductive layer 30 remains on the first and second surfaces 56, 58. As will be further explained below, the location at which the conductive layer 30 is formed corresponds to locations at which the die pads 12 and first and second leads 18, 20 for a package will be formed in the conductive foil 52.

As shown in FIGS. 2G and 2H, another light sensitive material 64 is deposited and patterned on the conductive layer 30 on the first and second surfaces 56, 58 of the conductive foil 52. The light sensitive material 64 may be the same type of material as light sensitive material 54, such as photoresist and may be positive or negative photoresist. In the illustrated embodiment, the light sensitive material 64 is patterned using known techniques and as indicated in FIG. 2G to produce patterned layers as shown in FIG. 2H.

FIG. 2H shows that the light sensitive material 64 remains located over the conductive layer 30 on both the first and second surfaces 56, 58 of the conductive foil 52. Additionally, the light sensitive material 64 is further located over a surface portion 66 of the second surface 58 of the conductive foil 52. The light sensitive material 64 forms a mask layer for a subsequent etching step that forms the die pads 12 and lead sets 70 as shown in FIG. 2I.

FIG. 2I shows the conductive foil 52 after an isotropic etch process. In one embodiment, the conductive foil 52 is etched by immersion in a bath of etchant and in some cases includes agitation techniques. In the bath, the conductive foil 52 is etched from the first surface 56 and from the second surface 58 through the entire thickness of the conductive foil 52.

The etching of the conductive foil 52 forms a plurality of die pads 12 spaced apart from each other. Between adjacent die pads 12 are one or more lead sets 70. Only one lead set 70 is shown between each adjacent die pads 12. However, it is to be understood that a plurality of lead sets 70 may be formed between adjacent die pads 12. Although not shown in the figures, the conductive foil 52 has been patterned and etched to include tie bars that mechanically couple the die pads 12 and the first and second lead end portions 72, 74 together. Typically, the tie bars are removed during subsequent processing, such as during a dicing step.

Each lead set 70 includes first and second lead end portions 72, 74 which are connected to one another by a connecting bar 76 as shown in FIG. 2I. The first and second lead portions 72, 74 have substantially planar upper surfaces 22 and the connecting bar 76 has a recessed surface 78. In that regard, the first and second lead end portions 72, 74 have a greater thickness than the connecting bar 76. The recessed surface 78 of the connecting bar 76 is optional. For instance in one embodiment, the upper surface of the connecting bar 76 is planar with the upper surfaces 22 of the first and second lead end portions 72, 74.

As shown in FIG. 2I, the lower surfaces 24 of the first and second lead end portions 72, 74 and the lower surfaces 16 of the die pads 12 may include a recessed portion 80 at their outer edges. The recessed portions 80 are optional however, and in other embodiments, the entire lower surface 16 of the die pads 12 and the lower surfaces 24 of the first and second lead end portions 72, 74 are substantially planar. The recessed portions 80 are formed in the bath etch due to having a larger surface area opening at the second surface 58 than the surface area opening at the first surface 56.

As shown in FIG. 2J, the light sensitive material 64 is removed from the upper and lower surfaces 14, 16 of the die pads 12, the upper and lower surfaces 22, 24 of the first and second lead end portions 72, 74, and the surface portion 66, which corresponds to a lower surface of the connecting bar 76. The removal of the light sensitive material 64 exposes the conductive layer 30 on the die pad 12, the first and second lead end portions 72, 74, and the surface portion 66 of the conductive foil 52. That is, the upper and lower surfaces 22, 24 of the first and second lead end portions 72, 74 are plated with the conductive layer 30, while the surface portion 66 corresponding to the connecting bar 76 remains unplated. As will be shown below, during assembly of a package the conductive layer 30 forms a mask layer for etching away the connecting bar 76 to separate the first and second lead end portions 72, 74. The leadframe strip 50 as shown in FIG. 2J may be used to assemble leadframe packages, such as the leadframe package 10 of FIG. 1, as will be explained below.

FIG. 2K shows that the second surface 58 of the leadframe strip 50, which includes the lower surface 24 of the first and second lead end portions 72, 74, and the lower surface 16 of the die pads 12 may optionally be placed on a supporting structure 68, such as tape. The supporting structure 68 may provide mechanical support for the leadframe strip 50 during the assembly process, which will be discussed below in reference to FIGS. 4A-4G. Alternatively or additionally, the supporting structure 68 may also be used as a barrier during a molding process for assembly a package as will be discussed further below.

FIGS. 3A-3K illustrate side views of a portion of a conductive foil 52 that is formed into a leadframe strip 50a at various stages of manufacturing in accordance with another embodiment of the present disclosure. The leadframe strip 50a formed by the manufacturing stages of FIGS. 3A-3K can be used to make the leadframe package 10 of FIG. 1.

In the embodiment shown in FIGS. 3A-3K, the conductive foil 52 is initially patterned to form the die pads 12 and lead sets 70 and then patterned for plating the conductive layer 30. This differs from the embodiment shown in FIGS. 2A-2K, which illustrates the conductive foil 52 being initially patterned for plating the conductive layer 30 and then patterned to form the die pads 12 and lead sets 70. Although the stages of assembly in FIGS. 3A-3K are in a different order from the stages of assembly in FIGS. 2A-2K, the various processing steps and materials used are substantially identical to the processing steps in FIGS. 2A-2K.

Figure 3A:
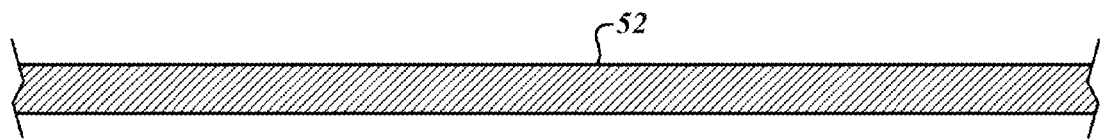
FIGS. 3A-3K illustrate side views of a portion of a conductive foil that is formed into a leadframe strip at various stages of manufacturing in accordance with another embodiment of the present disclosure.
Figure 3B:
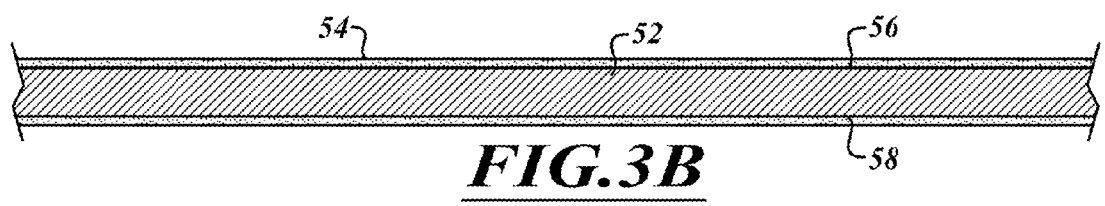
Figure 3C:
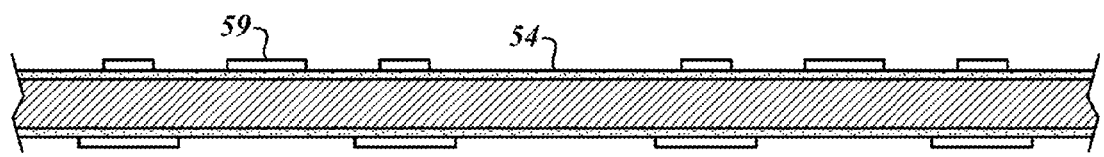
Figure 3D:
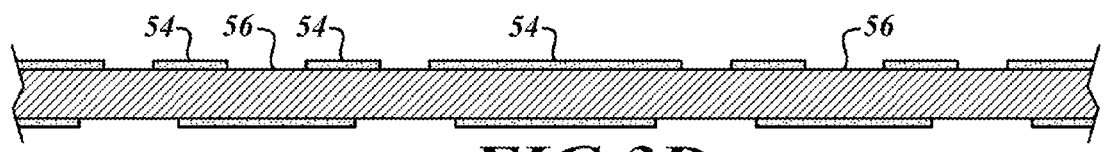
Figure 3E:
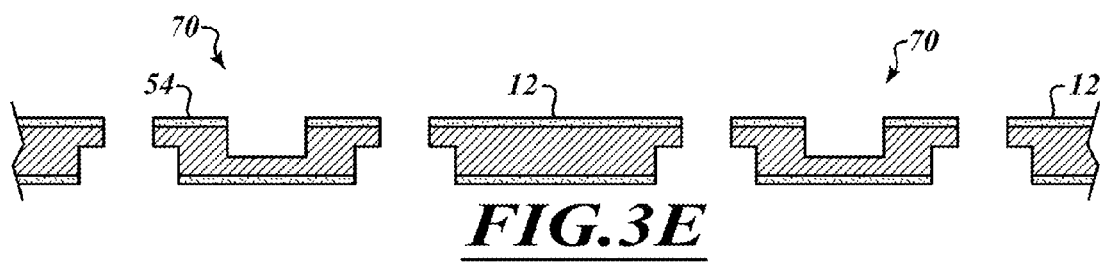
Figure 3F:
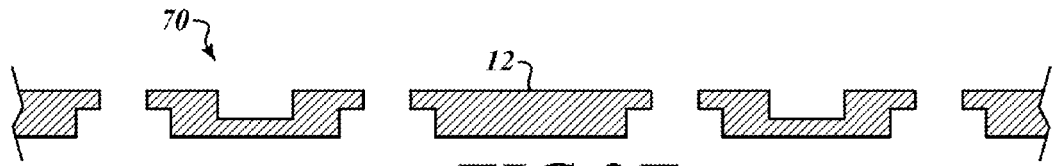

As shown in FIG. 3B, the light sensitive material 54, such as photoresist, is deposited on the first and second surfaces 56, 58 of the conductive foil 52. As shown by FIGS. 3C and 3D, portions of the light sensitive material 54 are patterned to form a mask layer for use during an etching step used to form the die pads 12 and the lead sets 70 as shown in FIG. 3E. As shown in FIG. 3F, after forming the die pads 12 and the lead sets 70, the light sensitive material 54 is removed.

Figure 3G:
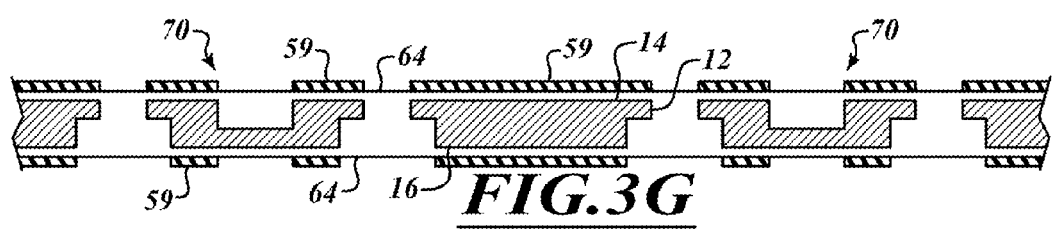
Figure 3H:
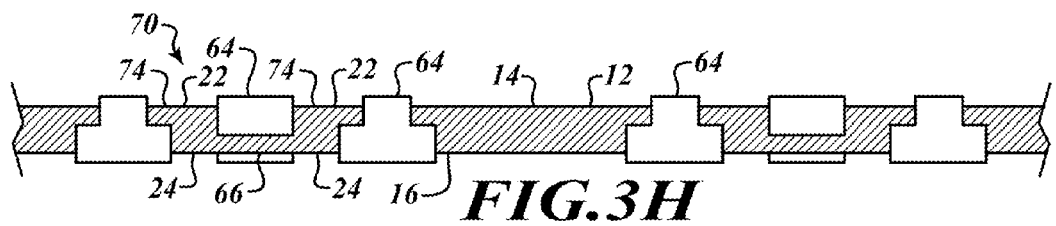
Figure 3I:
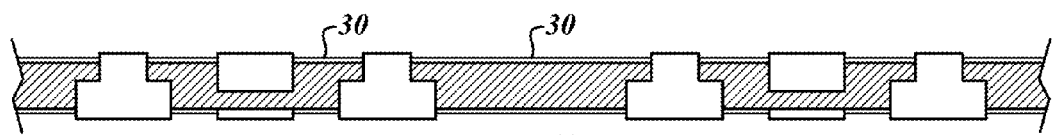

As shown in FIG. 3G, light sensitive material 64 is deposited around the die pads 12 and the lead sets 70. That is, the light sensitive material 64 is deposited alongside surfaces of the die pads 12 and the side surfaces of the lead sets 70, as well as over the upper and lower surfaces 14, 16 of the die pad 12 and the upper and lower surfaces of the lead sets 70. The light sensitive material 64 is patterned to form a mask layer as shown in FIG. 3H. The mask layer of the light sensitive material 64 exposes the upper and lower surfaces 14, 16 of the die pads 12 and some surfaces of the lead sets 70. In particular, the mask layer exposes the upper and lower surfaces 22, 24 of the first and second lead end portions 72, 74. FIG. 3H shows that the surface portion 66 of the conductive foil 52 is covered by the mask layer of the light sensitive material 64. Similarly, the light sensitive layer 64 is located over the recessed surface 78 of the connecting bar 76. FIG. 3I shows that the conductive layer 30 is then formed over the upper and lower surfaces 14, 16 of the die pads 12 and the upper and lower surfaces 22, 24 of first and second lead end portions 72, 74.

Figure 3J:
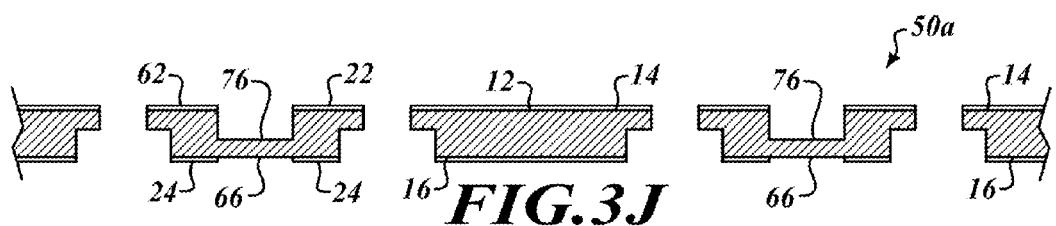
Figure 3K:
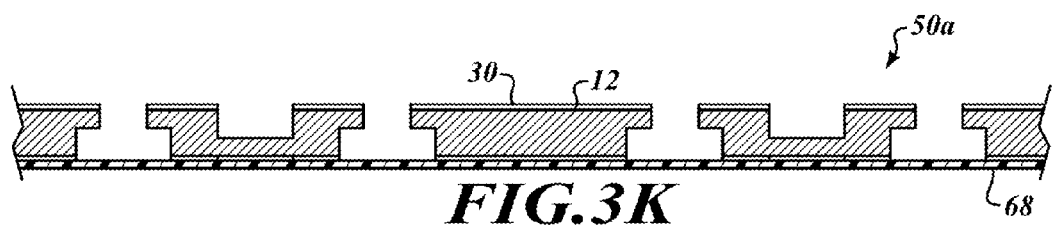

As shown in FIG. 3J, the light sensitive material 64 is removed to form the leadframe strip 50a. FIG. 3K shows that the leadframe strip 50a may be secured to the supporting structure 68 if further support is needed during the assembly process.

Figure 4A:
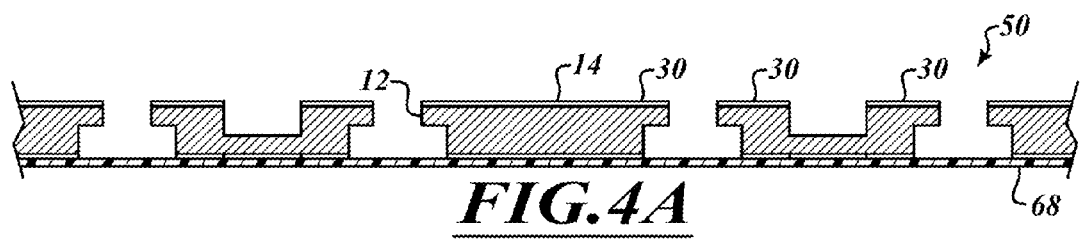
FIGS. 4A-4G illustrate cross-sectional views of various stages of assembly of leadframe packages, such as the leadframe package of FIG. 1, in accordance with an embodiment of the present disclosure.

FIGS. 4A-4G illustrate cross-sectional views of various stages of assembly of leadframe packages, such as the package 10 of FIG. 1, in accordance with an embodiment of the present disclosure. As shown in FIG. 4A, the assembly process begins with a leadframe strip, such as the leadframe strip 50 of FIG. 2K and the leadframe strip 50a of FIG. 3K. The leadframe strip 50 may be located on a supporting structure 68, such as tape. It is to be appreciated, however, that in some embodiments the assembly process does not include the supporting structure 68 and that the leadframe strip is suitably rigid to endure the assembly processing.

Figure 4B:
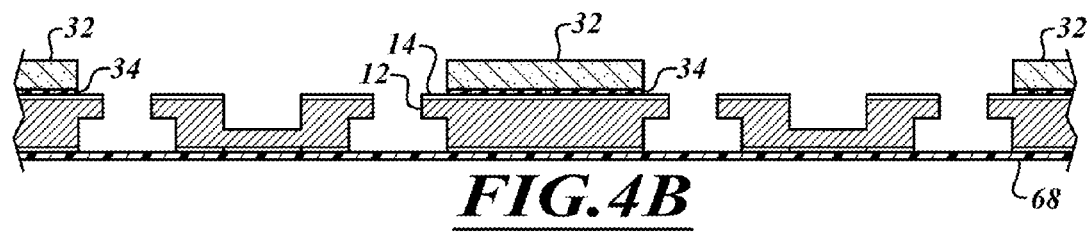

FIG. 4B shows that semiconductor dice 32 are placed over the upper surface 14 of the die pads 12 of the leadframe strip 50. The semiconductor die 12 may be secured to the die pads 12 by adhesive material 34, such as tape, paste, glue, or the like. The semiconductor die 32 may include an electrical device, such as an integrated circuit.

Figure 4C:
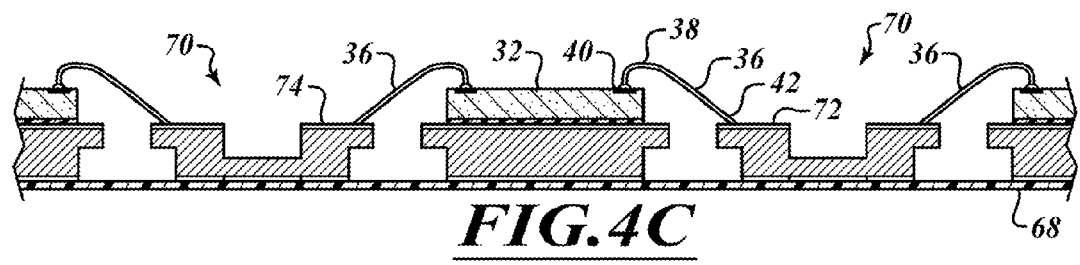

As shown in FIG. 4C, each dice 32 are electrically coupled to a respective end of a lead set 70. In the illustrated embodiment, a first end 38 of a conductive wire 36 is coupled to a bond pad 40 of the die and a second end 42 of the conductive wire 36 is coupled to a first lead end portion 72 of a lead set 70.

Although not shown, the dice may be electrically coupled to the lead sets by flip chip arrangement as is well known in the art. That is, the dice would be larger than shown in FIGS. 4B-4G so that the outer perimeter of each die would be located on the upper surface of adjacent leads. Solder balls located between the die and the lead would provide electrical communication therebetween. In that regard, the leads may provide electrical and mechanical support for the die. Thus, in some flip chip embodiments, the leadframe strip may not include die pad.

Figure 4D:
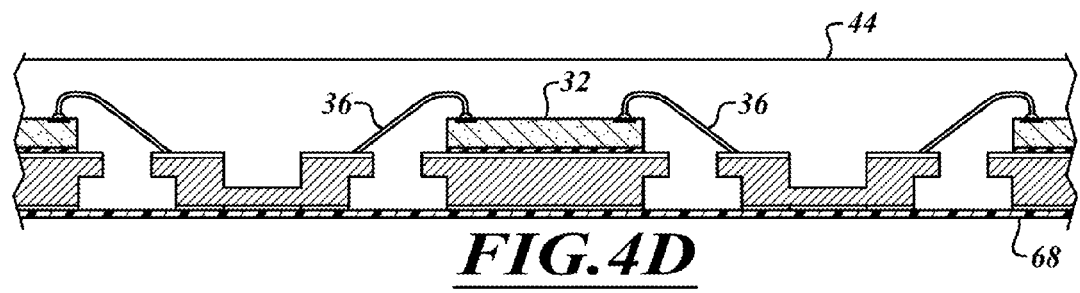

As shown in FIG. 4D, encapsulation material 44 is formed over the upper surfaces of the leadframe strip 50 so that the encapsulation material 44 surrounds the die 32, the conductive wires 36, and upper surfaces and side surfaces of the die pad 12 and the lead sets 70 of the leadframe strip 50. The encapsulation material 44 is an insulative material that protects the electrical components and materials from damage, such as corrosion, physical damage, moisture damage, or other causes of damage to electrical devices and materials. In one embodiment, the encapsulation material 44 is a polymer.

The encapsulation material 44 may be formed on the leadframe strip 50 by conventional techniques, for example by a molding process, and in some embodiments is hardened in a curing step. The supporting structure 68 may be used as a barrier during the molding process. That is, the supporting structure 68 stops the flow of the encapsulation material 44 over the lower surface of the leadframe strip 50 during the molding process.

Figure 4E:
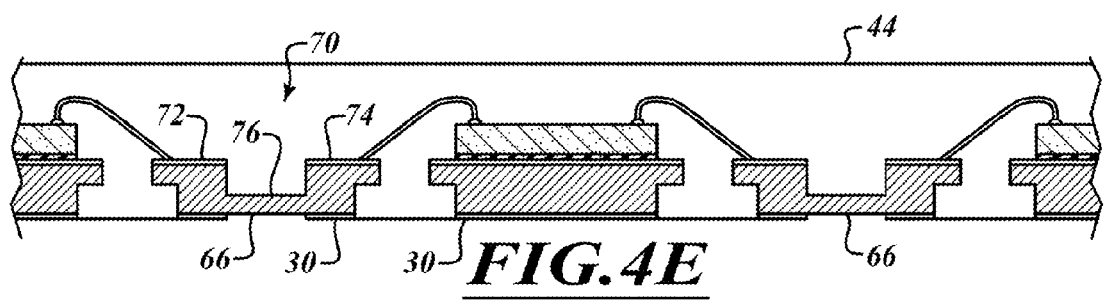

As shown in FIG. 4E, if used, the supporting structure 68 is removed, thereby exposing the surface portion 66 corresponding to the connecting bar 76 that is located between first and second lead end portions 72, 74. The encapsulation material 44 and the conductive layer 30 together form a mask layer for removing the connecting bar 76 in order to electrically isolate adjacent dice 32 from each other.

Figure 4F:
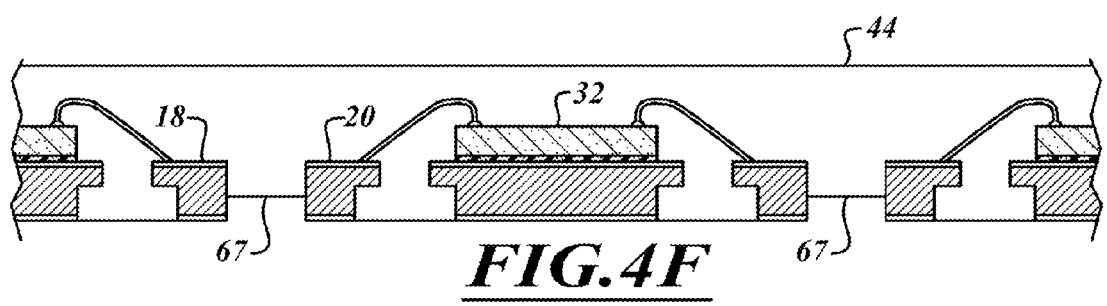

As shown in FIG. 4F, the connecting bar 76 is removed, thereby separating the first and second lead end portions 72, 74 from each other to form first and second leads 18, 20. In particular, the connecting bar 76 is etched from the surface portion 66 corresponding to the connecting bar using conventional leadframe etch chemistries. In one embodiment, the connecting bar 76 may be etched using ammonia base chemistries. The conductive layer 30 and the encapsulation material 44 are substantially resistant to the etch chemistries.

It is to be appreciated that in other embodiments, a light sensitive material may be deposited over the conductive layer 30 and the encapsulation material 44 to form a mask layer. In such an embodiment, the conductive layer 30 and the encapsulation material 44 would not need to be resistant to the etch chemistries. As shown in FIG. 4F, by removing the connecting bar 76 a surface 67 of the encapsulation material 44 is exposed.

As discussed above, the removal of the connecting bar 76 electrically isolates packages from each other, while at the same time maintaining mechanical connection to each other by the encapsulation material 44. In that regard, each package may be individually electrically tested while mechanically connected together by the encapsulation material 44 as shown in FIG. 4F, referred to as in leadframe strip form or prior to singulation.

By enduring electrical testing in leadframe strip form, the manufacturing process improves. For instance, the packages are more easily handled in the leadframe strip form and thus the testing process may be easier. Furthermore, the throughput through the testing process may increase. Thus, electrical testing of the packages can be completed in a simplified manner, and more efficiently than electrical testing of individual packages.

Figure 4G:
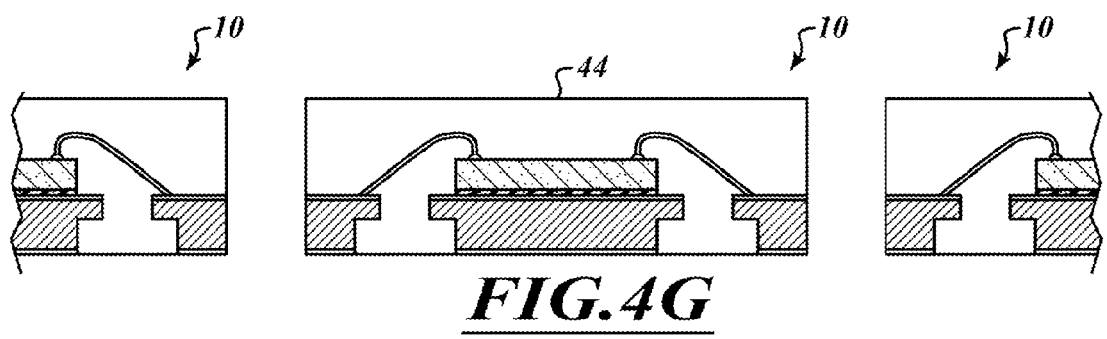

The manufacturing process further includes separating each package into individual packages 10 as shown in FIG. 4G. The packages can be separated by various dicing methods, including saw and laser. In one embodiment, the packages are separated in a dicing step using a saw blade that cuts through the encapsulation material 44 that remains between the first and second leads 18, 20. In addition, the saw blade may also cut or graze the outer surface of the leads. In that regard, the saw blade may have thickness that is substantially equal or slightly greater than the length of the surface 67 of the encapsulation material 44 that is exposed between the first and second leads 18, 20. In some embodiments, the surface 67 of the encapsulation material 44 may also be used as a saw street for visual alignment with the saw blade.

By using an etch step to separate the first lead end portion 72 from the second lead end portion 74 to form the first and second leads 18, 20 and then dicing through the encapsulation material 44, various benefits may be obtained. In particular, the two separation step process can prevent or reduce saw burrs from being formed on outer side surfaces of the first and second leads. That is, by first etching to separate the first and second lead end portions and second dicing sawing through the encapsulation material the risk of saw burrs on the surfaces of the outer surfaces of the leads is essentially eliminated.

Typically, when sawing through the connecting bar, the connecting bar causes the saw burrs. Thus, the thicker the connecting bar, the greater the saw burrs. By not sawing through the connecting bar, and only removing or grazing the outer surfaces of the first and second lead end portion 72, 74, the saw burrs are substantially eliminated or significantly reduced.

Additionally, separating the first and second lead end portions an etch step further eliminates lead smearing that is associated with saw blade dicing through the conductive foil 52 material of the leads.

Furthermore, by sawing through the encapsulation material 44 and cutting a relatively small portion of the outer surface of the first and second lead end portions 74, 76, the sawing speed may be increased, thereby increasing throughput through the sawing tools. In addition, the blade life of the saw blades used to cut the packages into individual packages will increase.

Figure 5:
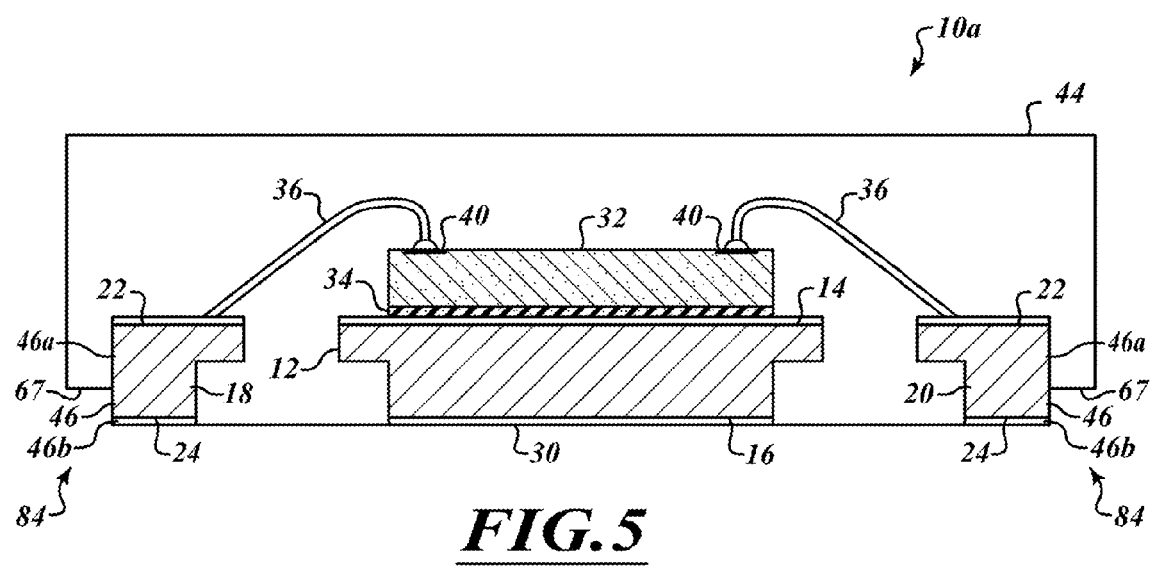
FIG. 5 is a cross-sectional view of another leadframe package made in accordance with an embodiment of the present disclosure.

FIG. 5 shows another leadframe package 10a in accordance with an embodiment of the present disclosure. The leadframe package 10a of FIG. 5 is substantially identical in materials and assembly to the leadframe package 10 of FIG. 1, except that encapsulation material 44 of the leadframe package 10a of FIG. 5 forms a recess 84 with the outer side surface 46 of the first and second leads 18, 20. In particular, the encapsulation material 44 extends over an upper portion 46a of the outer side surface 46 of the first and second leads 18, 20. A lower portion 46b of the outer side surface 46 of the first and second leads 18, 20 remains exposed.

The leadframe package 10a may be assembled in an identical manner as described in FIGS. 4A-4G. However, during singulation a portion of the surface 67 of the encapsulation material 44 remains between the first and second leads 18, 20 thereby forming the recess 84. In one embodiment, this may be achieved by using a saw blade or laser having a thickness that is smaller than the length of the surface 67 of the encapsulation material 44 located between the first and second leads 18, 20.

After singulation, the lower portion 46b of the outer side surface 46 of the first and second leads 18, 20 is bare material of the conductive foil 52, such as copper. In some embodiments, the lower portion 46b may be plated with the conductive layer after removing the connecting bar 76 but prior to singulation. This plating step would preferably occur after electrical testing of the packages in strip form as discussed above. The conductive layer would generally not adhere to the surface 67 of the encapsulation material 44, however, even if the conductive layer did adhere to the surface 67, the layer would be thin and easily removed during the dicing process.

The recess 84 may provide further assistance with board attachment, such as PCB attachment. In particular, solder material used to electrically couple the first or second lead 18, 20 to a surface of a board is encouraged to reflow up the outer side surface 46 of the first and second leads 18, 20 and abut the surface 67 of the encapsulation material 44. As the solder material abuts the surface 67 of the encapsulation material 44, the solder material thickens over the lower outer portion 36a of the first and second lead 18, 20. In that regard, the solder joint between the solder material and the outer surface 46 of the first or second leads 18, 20 has an increased strength and thereby improves the reliability of the connection of the package 10a to a board.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method comprising:
coupling a first die to a first die pad;
coupling a second die to a second die pad;
coupling a first end of a first conductive wire to a pad of the first die and coupling a second end of the first conductive wire to a first lead;
coupling a first end of a second conductive wire to a pad of the second die and coupling a second end of the second conductive wire to a second lead, the first and second leads being connected to each other by a connecting bar, the first lead, the second lead and the connecting bar each having a respective bottom surface;
encapsulating the first and second dice, the first and second conductive wires, and portions of the first and second leads and the connecting bar with encapsulation material, a surface of the encapsulation material being coplanar with a surface of the first and second die pads and the first and second leads;
removing the connecting bar by chemically etching the connecting bar to expose a surface of the encapsulation material; and
cutting through a first portion of the exposed surface of the encapsulation material such that second portions of the exposed surface of the encapsulation material remains and forms recesses proximate outer surfaces of the first and second leads, thereby forming individual packages.

2. The method of claim 1 further comprising plating the bottom surfaces of the first and second leads with Ni/Pd/Ag and leaving the bottom surface of the connecting bar un-plated, wherein removing the connecting bar by chemically etching the connecting bar comprises using a single etch chemistry to expose the surface of the encapsulation material.

3. The method of claim 1 wherein cutting through the encapsulation material at the exposed surface comprises using a saw blade to cut through the encapsulation material.

4. The method of claim 1 wherein cutting through the encapsulation material at the exposed surface comprises using a laser to cut through the encapsulation material.

5. The method of claim 1 wherein cutting through the encapsulation material comprises cutting through a portion of the encapsulation material at the exposed surface.

6. A method comprising:
coupling a first die to a first die pad;
coupling a second die to a second die pad;
electrically coupling the first die to a first end of a lead;
electrically coupling the second die to a second end of the lead;
encapsulating upper and side surfaces of the first die pad, the second die pad, and a portion of the lead with encapsulation material, a first surface of the encapsulation material being coplanar with a surface of the first and second die pads and the first and second leads;
in a single etch step, separating the lead into first and second leads by etching between the first and second ends to expose a second surface of the encapsulation material; and
dicing through a first portion of the second surface of the encapsulation material such that a second portion of the second surface of the encapsulation material remains and forms recesses proximate outer surfaces of the first and second leads.

7. The method of claim 6 wherein dicing comprises dicing using a saw blade or a laser.

8. The method of claim 6 wherein:
electrically coupling the first die to the first end of the lead comprises attaching a first end of a wire to a bond pad on the first die and attaching a second end of the wire to the first end of the lead;
electrically coupling the second die to the second end of the lead comprises attaching a first end of a wire to a bond pad on the second die and attaching a second end of the wire to the second end of the lead.

9. The method of claim 6 wherein prior to separating the lead, the lead includes a recessed portion between the first and second ends.

10. The method of claim 6 wherein the lead includes a middle portion between the first and second ends, wherein the method further comprises plating a bottom surface of the lead at the first and second ends without plating the middle portion.

11. The method of claim 6 wherein the first die includes a first electronic device and the second die includes a second electronic device, the method further comprising electrically testing the first electronic device and the second electronic device.

12. A leadframe strip assembly comprising:
a first die pad adjacent to a second die pad, each of the first and second die pads having a respective upper surface;
a first die located on the upper surface of the first die pad;
a second die located on the upper surface of the second die pad;
first and second leads located between the first and second die pads, the first lead having a first end proximate the first die pad, the second lead having a first end proximate the second die pad, each of the first lead and the second lead having a second end spaced apart from each other; and
encapsulation material located around the first die and the second die, the encapsulation material further located around portions of the first and second die pads and portions of the first and second leads, the encapsulation material having a first portion of a bottom surface that is flush with a bottom surface of the first die pad, a bottom surface of the second die pad, and a bottom surface of the first and second leads, the encapsulation material including a second portion of the bottom surface that is located between the second ends of the first and second leads and is raised relative to the bottom surface of the first portion exposing a first portion of the side surfaces of the first and second leads, a second portion of the side surfaces of the first and second leads remaining covered by encapsulation material.

13. The leadframe strip assembly of claim 12 further comprising
a first conductive wire electrically coupling the first die to the first lead;
a second conductive wire electrically coupling the second die to the second lead.

14. The leadframe strip assembly of claim 12 wherein the second portion of the bottom surface forms a saw street for separating the leadframe strip assembly into separate packages.

15. The leadframe strip assembly of claim 13 wherein the bottom surface of the first lead and the second lead is plated with one or more metal materials.

16. The leadframe strip assembly of claim 15 wherein the bottom surface of the first lead and the second lead is plated with Ni/Pd/Ag.

17. The method of claim 1 wherein removing the connecting bar by chemically etching the connecting bar comprises using a single etch chemistry to expose the surface of the encapsulation material.

18. The method of claim 5 wherein cutting through the portion of the encapsulation material at the exposed surface forms a recess in the encapsulation material adjacent to an outer surface the first and second leads.

19. The method of claim 1 further comprising plating top surfaces of the first and second leads with a material, without plating a top surface of the connecting bar, wherein removing the connecting bar by chemically etching the connecting bar comprises using a single etch chemistry to expose the surface of the encapsulation material.

20. The method of claim 6 wherein dicing the encapsulation material between the separated lead comprises dicing the encapsulation material to form recesses in the encapsulation material adjacent first and second ends of the lead, respectively.

* * * * *

UNITED STATES PATENT AND TRADEMARK OFFICE
CERTIFICATE OF CORRECTION

PATENT NO. : 9,012,268 B2  
APPLICATION NO. : 13/931325  
DATED : April 21, 2015  
INVENTOR(S) : Jonathan Jaurigue et al.

Page 1 of 1

It is certified that error appears in the above-identified patent and that said Letters Patent is hereby corrected as shown below:

ON THE TITLE PAGE

Item (73)
"STMicroelectronics, Inc., Lagura, (PH)" should read, --STMicroelectronics, Inc., Calamba, Laguna, (PH)--.

Signed and Sealed this  
Tenth Day of May, 2016

Michelle K. Lee  
*Director of the United States Patent and Trademark Office*